(12) United States Patent
Rieger et al.

(10) Patent No.: US 9,754,859 B2
(45) Date of Patent: Sep. 5, 2017

(54) SEMICONDUCTOR DEVICE

(71) Applicant: Infineon Technologies AG, Neubiberg (DE)

(72) Inventors: Walter Rieger, Arnoldstein (AT); Franz Hirler, Isen (DE); Martin Poelzl, Ossiach (AT); Manfred Kotek, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/037,057

(22) Filed: Sep. 25, 2013

(65) Prior Publication Data

US 2014/0021637 A1     Jan. 23, 2014

Related U.S. Application Data

(63) Continuation of application No. 11/132,151, filed on May 18, 2005, now Pat. No. 8,564,061.

(30) Foreign Application Priority Data

May 18, 2004   (DE) .................... 10 2004 024 659

(51) Int. Cl.
*H01L 29/732*     (2006.01)
*H01L 23/48*      (2006.01)
(Continued)

(52) U.S. Cl.
CPC ...... *H01L 23/481* (2013.01); *H01L 21/76838* (2013.01); *H01L 23/485* (2013.01); *H01L 21/76895* (2013.01); *H01L 2924/0002* (2013.01)

(58) Field of Classification Search
CPC . H01L 23/481; H01L 23/485; H01L 29/7802; H01L 29/7803; H01L 29/781;
(Continued)

(56) References Cited

U.S. PATENT DOCUMENTS 5,204,286 A  *  4/1993  Doan ............................ 438/618
5,279,990 A     1/1994  Sun et al.
(Continued)

FOREIGN PATENT DOCUMENTS

| DE | 10236682 A1 | 6/2003 |
|---|---|---|
| KR | 100 20 95 97 | 9/1998 |
| WO | 0007241 A1 | 2/2000 |

OTHER PUBLICATIONS

German Patent Application No. 10 2004 024 659.9 Office Action dated Feb. 5, 2014.

*Primary Examiner* — Kenneth Parker
*Assistant Examiner* — John Lin
(74) *Attorney, Agent, or Firm* — Maginot, Moore & Beck LLP

(57) ABSTRACT

A semiconductor device includes a semiconductor substrate, a doped zone, a polysilicon layer and an elongate plug structure. The doped zone is within the semiconductor substrate. The polysilicon layer is disposed in a trench electrically isolated from the semiconductor substrate by an insulating layer. The elongate plug structure extends in a lateral direction in or above the semiconductor substrate. The elongate plug structure provides electrical connection between the doped zone and the polysilicon layer.

9 Claims, 6 Drawing Sheets

(51) Int. Cl.
*H01L 21/768* (2006.01)
*H01L 23/485* (2006.01)

(58) Field of Classification Search
CPC ............. H01L 29/7812; H01L 29/7827; H01L 29/78642
USPC .......... 257/343, E29.258, 341, 302; 438/672
See application file for complete search history.

(56) References Cited

U.S. PATENT DOCUMENTS

| | | | |
|---|---|---|---|
| 5,442,211 A * | 8/1995 | Kita | 257/301 |
| 5,471,418 A | 11/1995 | Tanigawa | |
| 5,475,240 A | 12/1995 | Sakamoto | |
| 5,508,541 A * | 4/1996 | Hieda | H01L 27/108 257/301 |
| 5,545,583 A | 8/1996 | Lam et al. | |
| 5,600,170 A * | 2/1997 | Sugiyama et al. | 257/382 |
| 5,614,751 A * | 3/1997 | Yilmaz | H01L 29/402 257/341 |
| 5,804,851 A * | 9/1998 | Noguchi et al. | 257/304 |
| 5,985,708 A | 11/1999 | Nakagawa et al. | |
| 6,174,803 B1 | 1/2001 | Harvey | |
| 6,236,079 B1 * | 5/2001 | Nitayama | H01L 27/10832 257/304 |
| 6,265,278 B1 | 7/2001 | Alsmeier et al. | |
| 6,724,085 B2 | 4/2004 | Tomita | |
| 6,797,563 B2 * | 9/2004 | Miyai et al. | 438/257 |
| 7,276,764 B1 | 10/2007 | Sakamoto | |
| 2002/0024076 A1 * | 2/2002 | Nakabayashi | H01L 27/10894 257/296 |
| 2002/0177277 A1 | 11/2002 | Baliga | |
| 2003/0107133 A1 | 6/2003 | Tomita | |

* cited by examiner

SEMICONDUCTOR DEVICE

This application is a continuation of U.S. patent application Ser. No. 11/132,151, filed May 18, 2005, which in turn claims priority from German Patent Application No. 102004024659.9, which was filed on May 18, 2004, all of which are incorporated herein by reference in its entirety.

FIELD OF THE INVENTION

The invention relates to a semiconductor device, in particular a power semiconductor device.

BACKGROUND

Power semiconductor devices (semiconductor devices with a parallel circuit comprising a plurality of cells, for example MOS (metal oxide semiconductor) transistor cells or bipolar transistor cells for processing high currents/voltages, are generally designed such that they have a lowest possible on resistivity $R_{on}$. A ($R_{on}$=on resistance, A=cross-sectional area of the semiconductor volume permeated by electric currents) and also a highest possible integration density.

In order to keep the on resistivity as low as possible, it is advisable to use thick metallization layers since it is possible in this way to reduce shunt current resistance components within the metallization layers. However, the use of thick metallization layers has the disadvantage that space-saving wirings and thus high integration densities are not possible within edge regions or logic regions of the power semiconductor device. This problem area shall be explained by way of example below with reference to FIGS. 1 to 3.

FIG. 1 shows a part of an edge section of a power semiconductor device in a cross-sectional illustration. An insulation layer 2 is arranged on a substrate 1, in which a plurality of doped zones are formed (not shown), a patterned metallization layer in turn being arranged on said insulation layer. A first metallization region 3 and also a second metallization region 4 of the metallization layer can be seen in FIG. 1. The pattered metallization layer is coated with a passivation layer 5. A plug P is furthermore provided, which electrically connects the metallization region 4 to a field plate made of polysilicon (not shown here) and thus enables a vertical current flow between the metallization region 4 and the field plate. The field plate serves for potential reduction here.

In order to minimize shunt current resistance components (i.e. resistance components that take effect in the case of a current flow parallel to the semiconductor surface—here into the plane of the drawing) within the metallization regions 3, 4, the metallization regions 3, 4 have thicknesses of approximately 5 µm. The consequence of this is that the patterning process (wet-chemical etching was used in this example) gives rise to non-negligible, undesirable widenings of the metallization regions 3, 4 in the respective lower parts thereof: thus, a width $B_1$ in the upper part of the first metallization region 3 is approximately 12 µm, whereas a width $B_2$ at the base of the first metallization region 3 is approximately 18 µm. A width $B_3$ between the first metallization region 3 and the second metallization region 4 is approximately 12 µm.

The widenings described above, which result on the one hand from the thickness of the metallization regions 3, 4 and on the other hand from the nature of the patterning method, prevent a miniaturization of the power semiconductor device: if the dimensions between the metallization regions 3, 4 are decreased further, then the functionality of the power semiconductor device is no longer ensured even in the case where the fabrication procedure exhibits small process fluctuations.

SUMMARY

The object on which the invention is based is to provide a semiconductor device that enables a space-saving wiring in edge regions, logic regions or within the cell array. This object is achieved according to the invention by means of a semiconductor device in accordance with at least one embodiment described herein.

A first exemplary embodiment is a semiconductor device that includes a semiconductor substrate, a doped zone, a polysilicon layer and an elongate plug structure. The doped zone is within the semiconductor substrate. The polysilicon layer is disposed in a trench electrically isolated from the semiconductor substrate by an insulating layer. The elongate plug structure extends in a lateral direction in or above the semiconductor substrate. The elongate plug structure provides electrical connection between the doped zone and the polysilicon layer.

The above described features and advantages, as well as others, will become more readily apparent to those of ordinary skill in the art by reference to the following detailed description and accompanying drawings.

BRIEF DESCRIPTION OF THE DRAWINGS

The invention is explained in more detail below in exemplary embodiment with reference to the figures, in which.

In the figures, identical or mutually corresponding devices or device groups are identified by the same reference numerals.

DETAILED DESCRIPTION

Figure 1:
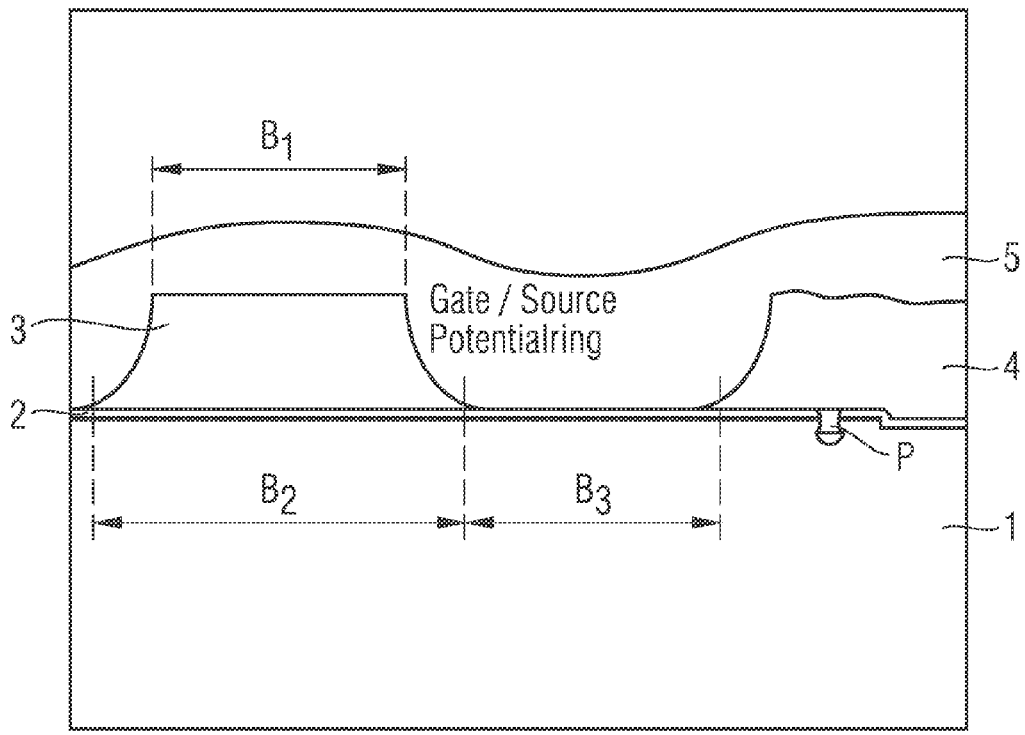
FIG. 1 shows an edge termination of a conventional power semiconductor device in a cross-sectional illustration.

The semiconductor device according to at least one embodiment has elongate plug structures extending in the lateral direction, which are provided in or respectively on the semiconductor device. The plug structures serve as electrical lines in order to carry lateral current flows within the cell array, within edge regions or logic regions of the semiconductor device.

Embodiments of the invention can be applied to power semiconductor devices, in particular. Therefore, the description below always talks of "power semiconductor device". However, all statements equally hold true for any desired semiconductor devices.

In accordance with at least some embodiments, at least one portion of the patterned metallization layer is replaced by corresponding plug structures. Plug structures are known, but have hitherto been used only as short, vertical contact-making connections between semiconductor zones and metallization layers arranged thereabove (usually configured as contact holes filled with polysilicon). In accordance with embodiments of the invention, by contrast, the plug structures are used as electrical lines in order to carry lateral currents over "longer" paths and can thus function at least in part as a "wiring plane". The plug structures are preferably realized in the form of laterally oriented trenches that are introduced into the power semiconductor device and are filled with polysilicon, tungsten or similar materials. Since such plug structures (in particular with polysilicon) can be fabricated in a manner that is extremely space-saving and precise, the integration density of the power semiconductor device can be increased. Furthermore, unlike what has been required hitherto, it is no longer necessary to give consideration to the design of the power metallization to an excessively great extent when producing a wiring within the cell array, the edge region or the logic region of the power semiconductor device. Additional metallization layers required hitherto, for example for wiring/making contact with logic regions, can be obviated since this function is performed by the plug structures. It is thus possible to construct power semiconductor devices which have only one patterned metallization layer. The use of plug structures as electrical lines is advantageous in particular for realizing low-current lines.

The plug structures are preferably fabricated as follows:
application of an insulation layer to a semiconductor body,
patterning of the insulation layer, so that cutouts are produced in the insulation layer,
filling of the cutouts with conductive material, and
etching back of the conductive material from the surface of the semiconductor device.

The plug structures may be used for example for making contact with semiconductor zones, in particular semiconductor zones within the cell array of the power semiconductor device. In this case, the plug structures may bear at least in part directly on the semiconductor zones or be connected in part by a conductive barrier to the semiconductor zones. As an alternative, the plug structures may be routed such that they are isolated at least in part by an insulation layer from the semiconductor zones or from metal zones (in particular of the cell array).

Furthermore, the plug structures may serve as an electrical connection between a semiconductor zone and a conductive layer which runs within a trench formed in the semiconductor zone, the plug structures simultaneously functioning as "wiring" for which a metallization layer arranged above the plug structures is normally used.

The plug structures may furthermore be utilized as an electrical connection between two metallization regions/semiconductor regions, e.g. power metallization regions/power semiconductor regions, that lie next to one another or one above the other. The plug structures may generally be routed such that they do not make contact with any (power) metallization regions of the semiconductor device. It is also possible for the plug structures to be configured such that, as already mentioned, metallization regions, in particular power metallization regions, of the semiconductor device are contact-connected only piece by piece.

In a preferred embodiment, a first portion of the plug structures forms vertical electrical connections between semiconductor zones and a metallization layer arranged thereabove. A second portion of the plug structures is formed in the form of electrical lines for a lateral current flow. It is also possible for a plug structure to serve simultaneously both as a vertical electrical connection and as an electrical line for a lateral current flow.

A further exemplary application of the plug structures according to the invention is to form parts of the plug structures as layers within a trench, the position of the layers (trenches) within the semiconductor device and also the dimensions of the layers being chosen such that a specific potential profile is obtained locally within the semiconductor device. By way of example, the layers are formed within an edge trench for the termination of the power semiconductor device, the layers being directly connected to a metallization region provided above the edge trench. In this case, the plug structure is preferably connected only in part to the metallization region, so that the current flow in the plug structure is also effected laterally at least in part.

If the dimensions of the plug structures are chosen such that the lateral current that flows through the respective plug structure has to overcome a defined electrical resistance, the plug structures serving as electrical lines may also be used as resistance lines. The smaller the dimensions of the plug structure (of the electrical line made of polysilicon or tungsten) the higher the electrical resistance.

The power semiconductor device according to at least some embodiments, as described above, accordingly has the advantage that the dimensions of an edge termination no longer have to be adapted to the design concept of the power metallization. Moreover, within logic regions, a logic metallization which has been used hitherto and which is thinner than the power metallization (and is used to fabricate lines for low currents) can be entirely or partly omitted since the power metallization can be replaced by the plug structures. In accordance with some embodiments, a wiring in the µm range (or smaller) is accordingly fabricated by means of plug structures, for example by means of a poly-filled elongate contact hole strip, without metallization planes being necessarily required. The width of the contact hole strips may be between 0.1 µm and 1 µm, by way of example. However, the invention is not restricted thereto. From the standpoint of production technology it is advantageous for the aspect ratio, i.e. the ratio of depth/width of the contact hole strip (i.e. of the plug structure) to be greater than 1 since the plug structure can then be fabricated more simply.

Figure 3:
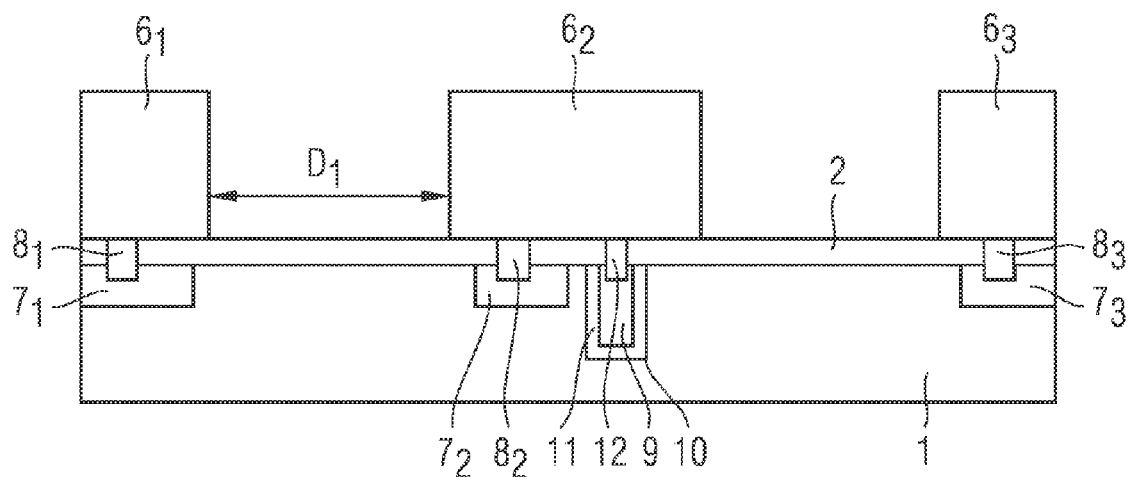
FIG. 3 shows a part of a cell array of a conventional power semiconductor device in a cross-sectional illustration.

FIG. 3 shows a power semiconductor device in a cross-sectional illustration, which device has a substrate 1, an insulating layer 2 arranged on the substrate 1, and a plurality of metallization regions $6_{0.1}$ to $6_{0.3}$ arranged on the insulating layer 2. A plurality of doped zones $7_1$ to $7_3$ are provided within the substrate 1. Each of the doped zones $7_1$ to $7_3$ is electrically connected to one of the metallization regions $6_1$ to $6_3$ by means of a polysilicon plug $8_1$ to $8_3$. Furthermore, a polysilicon layer 9 formed within a trench 10 is provided within the substrate 1. The polysilicon layer 9 is electrically insulated from the substrate 1 by an insulation layer 11 and is electrically connected to the metallization region $6_2$ by means of a polysilicon plug 12, so that an electrical connection is produced between the polysilicon layer 9 and the doped zone $7_2$.

Figure 2:
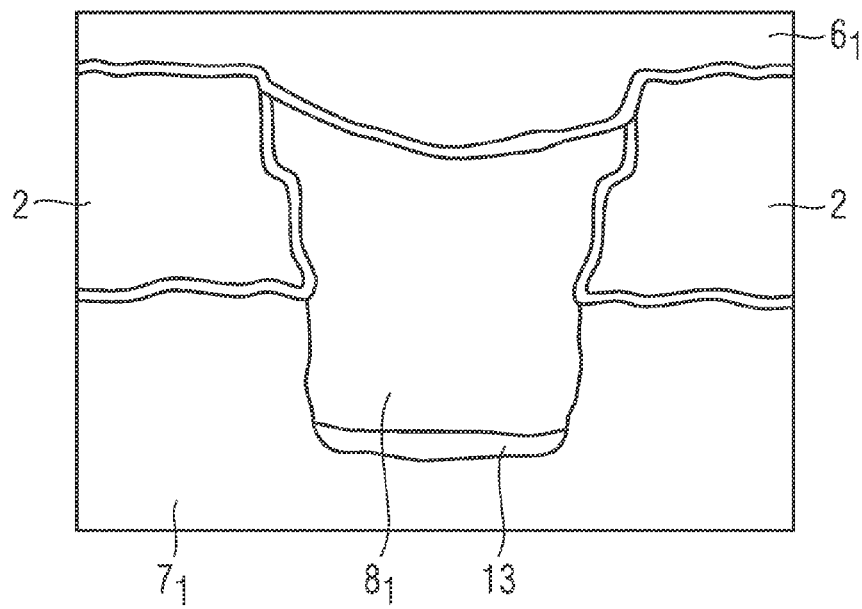
FIG. 2 shows a part of a cell array of a conventional power semiconductor device in a cross-sectional illustration.

FIG. 2 shows an enlargement of the junction between the metallization region $6_1$, the polysilicon plug $8_1$ and the doped region $7_1$ shown in FIG. 3. The trench/the contact hole which is filled by the polysilicon plug $8_1$ generally has a large aspect ratio (in this case: width <0.4 μm×depth=0.9 μm). This means that it is not readily possible to fill the contact hole/the trench with a metal, for example Al, SiCu or the like. For this reason, polysilicon is used for filling, a metal layer 13 being provided as a metal-like barrier, for example TiSi, in the lower part of the contact hole/the trench. The metal layer 13 is necessary in particular when both an n-doped and a p-doped region are provided within the doped zone $7_1$ and both regions are to be contact-connected by the polysilicon. The metallization region $6_1$ may comprise AlSiCu, by way of example. As an alternative, Ti/TiN or AlCu may be used. In this case, the Ti/TiN contact layer should be patterned by means of an anisotropic plasma etching step, for example, after the AlCu patterning. A removal of Si grit after the patterning of AlSiCu may then be obviated. The polysilicon plug $8_1$ may be replaced by a tungsten plug, in which case a dense barrier (e.g. Ti/TiN) should be used. The explanations given in this section (in particular with regard to the materials) also apply to the embodiments according to the invention.

Figure 4:
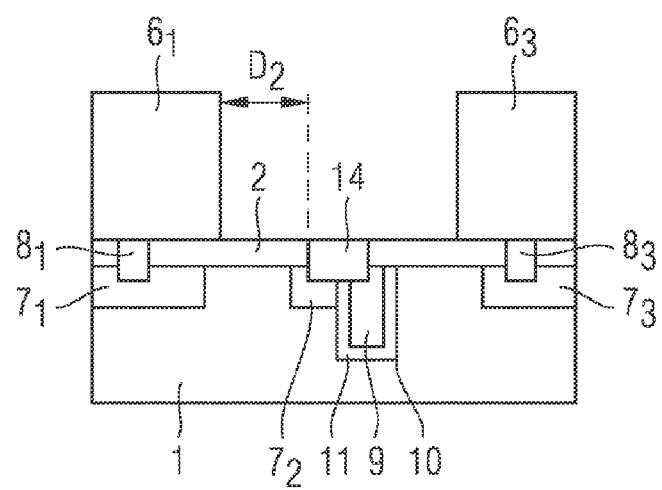
FIG. 4 shows a first embodiment of a power semiconductor device according to the invention in a cross-sectional illustration.

FIG. 4 shows a first exemplary embodiment of a power semiconductor device according to the invention. In this embodiment, by comparison with the construction shown in FIG. 3, the metallization region $6_2$ has been replaced by a polysilicon plug 14 that forms an electrical connection between the doped zone $7_2$ and the polysilicon layer 9. The polysilicon plug 14 extends in the lateral direction. The dimensions of the polysilicon plug 14 are so compact that, with the functionality of the power semiconductor device remaining the same, it is possible to significantly reduce the distance between the metallization region $6_1$ and the metallization region $6_3$, as can be seen from FIGS. 3 and 4: in FIG. 3, it is necessary to comply with a minimum distance $D_1$ between the metallization region $6_1$ and the metallization region $6_2$ in order to guarantee a reliable functioning of the power semiconductor device. A comparable distance $D_2$ between the first metallization region $6_1$ and the polysilicon plug 14 may turn out to be very much smaller. Ideally, the distance between the first metallization region $6_1$ and the third metallization region $6_3$ is $D_1$.

Replacing the metallization region $6_2$, the polysilicon plug $8_2$ and also the polysilicon plug 12 by the polysilicon plug 14 thus enables a higher integration density of the power semiconductor device.

In all of the embodiments, the polysilicon plugs may also be replaced by corresponding tungsten plugs or by arbitrary metal plugs.

Figure 5:
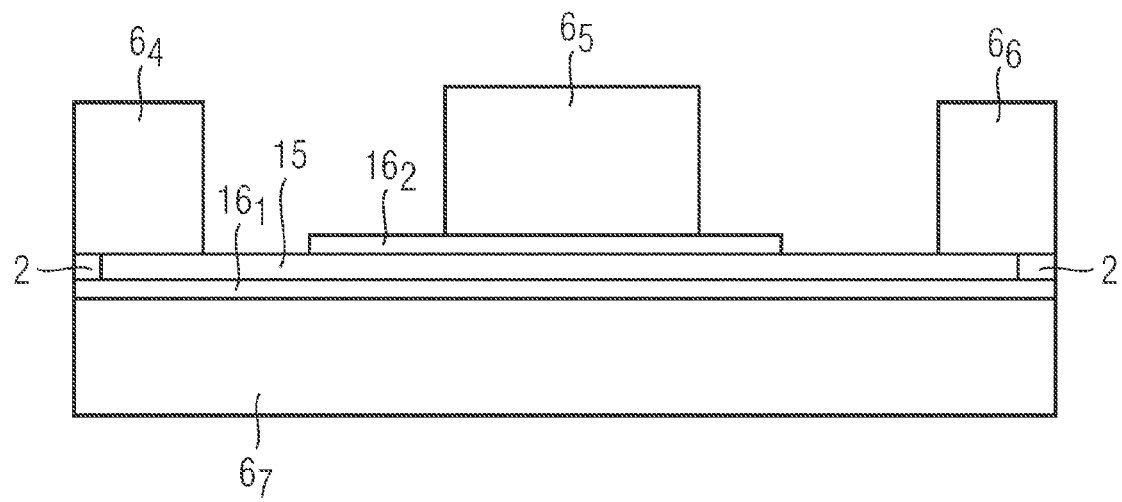
FIG. 5 shows a second embodiment of a power semiconductor device according to the invention in a cross-sectional illustration.

In FIG. 5, a polysilicon plug 15 embedded in a trench is used in order to electrically connect one metallization region $6_4$ to another metallization region $6_6$. The polysilicon plug 15 is electrically insulated from a metallization region $6_7$ by means of a first insulation layer $16_1$, and from a metallization region $6_5$ by a second insulation layer $16_2$.

Figure 6:
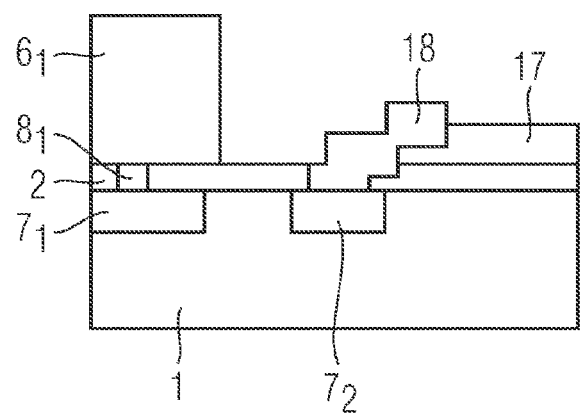
FIG. 6 shows a third embodiment of a power semiconductor device according to the invention in a cross-sectional illustration.

The embodiment shown in FIG. 6 shows a polysilicon layer 17, which is connected to the doped zone $7_2$ by means of a polysilicon plug 18. Both the polysilicon plug 18 and the polysilicon layer 17 extend in the lateral direction perpendicular to the plane of the drawing.

Figure 7:
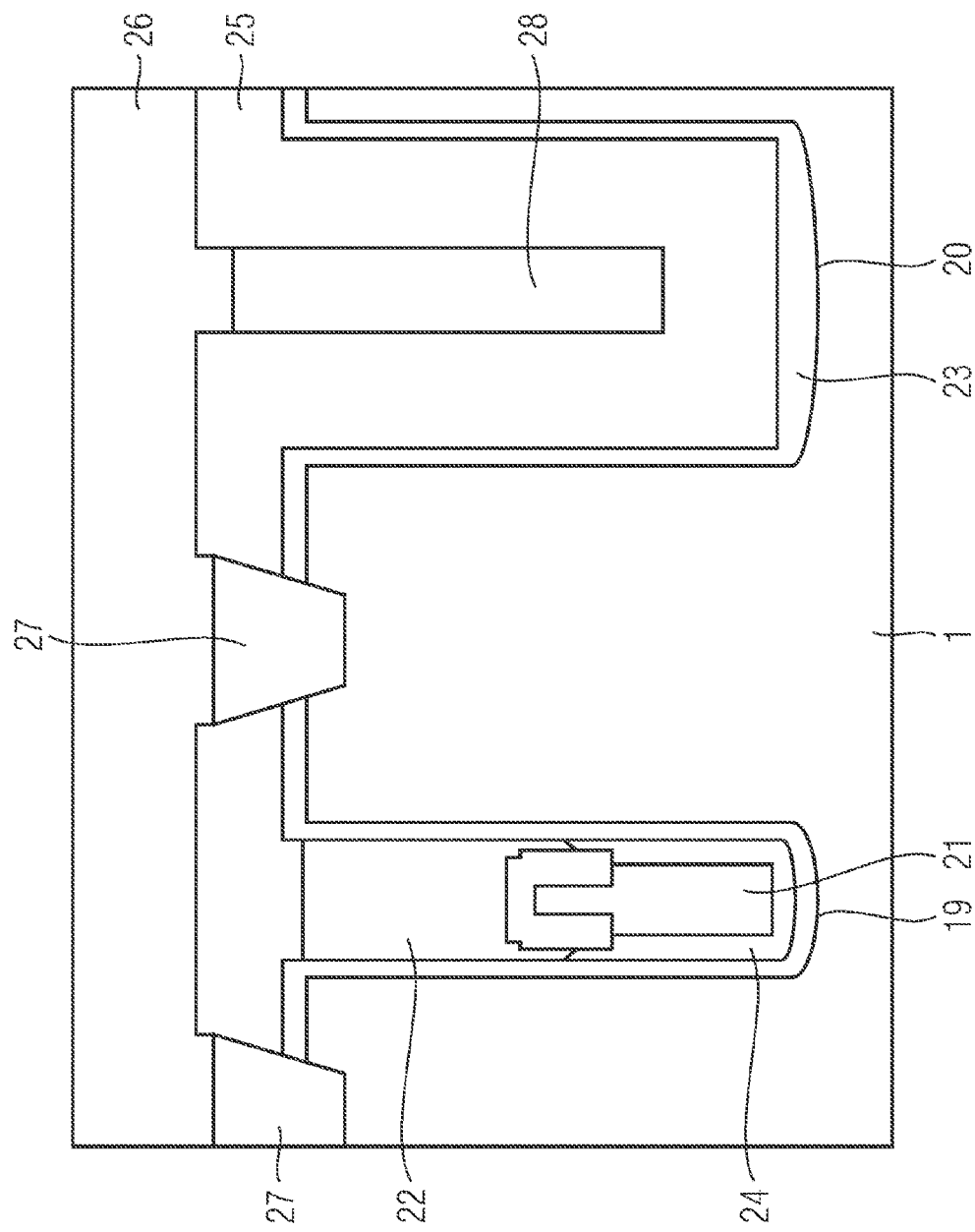
FIG. 7 shows a fourth embodiment of a power semiconductor device according to the invention in a cross-sectional illustration.

FIG. 7 shows a further exemplary application. A cell array trench 19 and also an edge trench 20 are provided in a substrate 1. As is generally customary, a source electrode 21 and also a gate electrode 22 (which are fabricated from polysilicon, for example) are arranged within the cell array trench 19. The cell array trench 19 and also the edge trench 20 are electrically insulated from the substrate by means of suitable insulation layers 23, 24. A thick insulation layer 25, for example an oxide layer, is provided above the cell array trench 19 and within the edge trench 20. A metallization layer 26 is arranged above the insulation layer 25. Doped zones (not shown here) are electrically connected to the metallization layer 26 by means of polysilicon plugs 27. Furthermore, a polysilicon plate 28, which is electrically connected to the metallization layer 26, is provided within the edge trench. The polysilicon plate 28 is produced together with the polysilicon plugs 27 in one step.

In order to form the polysilicon plugs 27 and also the polysilicon plates 28, a uniform layer made of polysilicon is deposited on the patterned insulation layers 23 to 25 and the polysilicon layer is subsequently etched back, so that only the polysilicon plugs 27 and also the polysilicon plate 28 remain. The metallization layer 26 may subsequently be applied.

Figure 8:
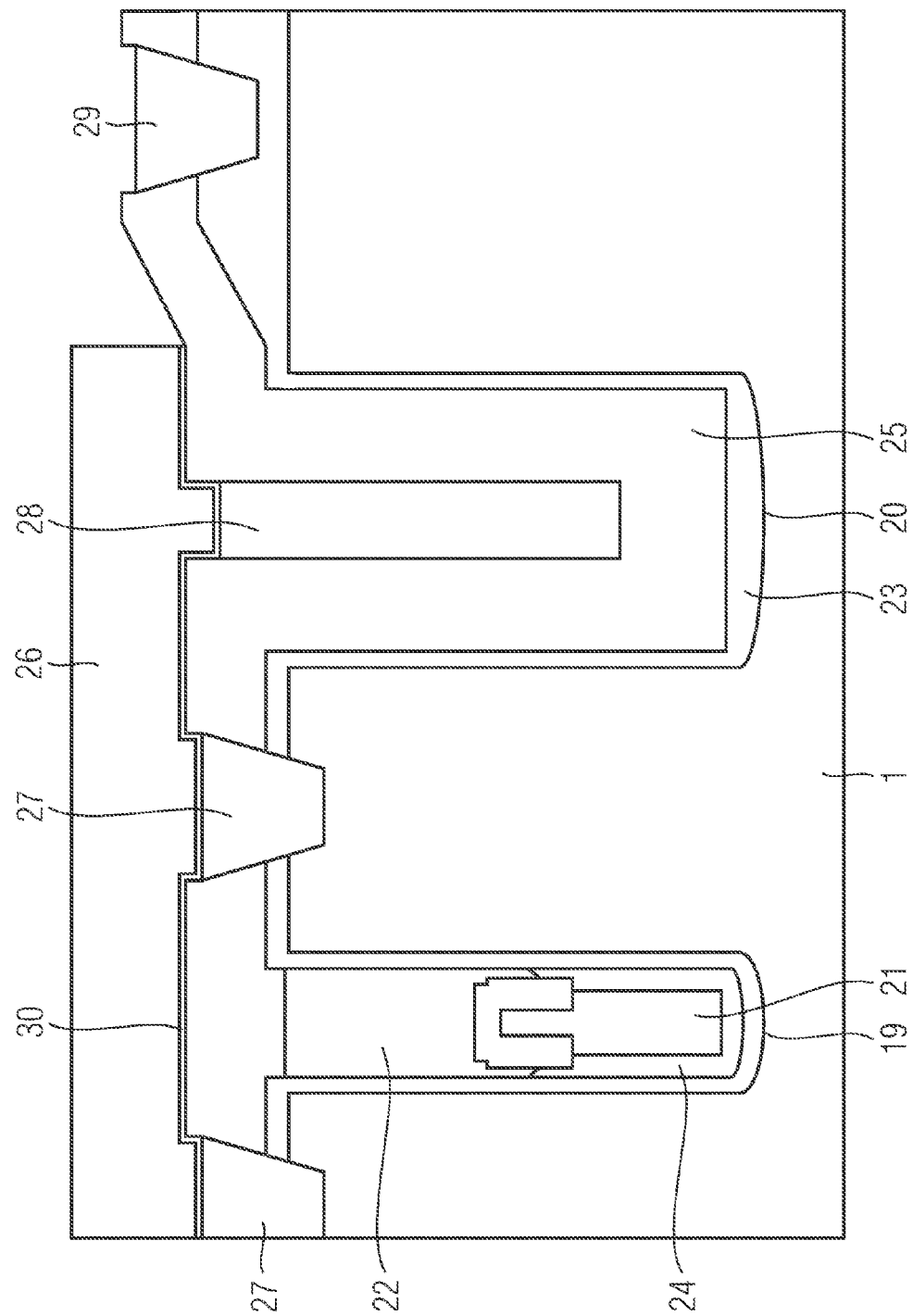
FIG. 8 shows a fifth embodiment of a power semiconductor device according to the invention in a cross-sectional illustration.

FIG. 8 shows a further exemplary embodiment of a power semiconductor device according to the invention. This exemplary embodiment differs from the exemplary embodiment shown in FIG. 7 merely by the fact that a laterally extending polysilicon plug 29 is additionally provided, which is electrically insulated from the substrate 1 by the insulation layer 23. The polysilicon plug 29 may serve for example as a gate/source potential ring or as a logic interconnect.

A further difference is that the metallization layer 26 in FIG. 7 preferably comprises AlSiCu, but the metallization layer 26 in FIG. 8 preferably comprises AlCu, an additional Ti/TiN barrier 30 being provided in FIG. 8. An Si grit removal after the patterning of the metallization layer 26 can thus be obviated in FIG. 8.

Figure 9:
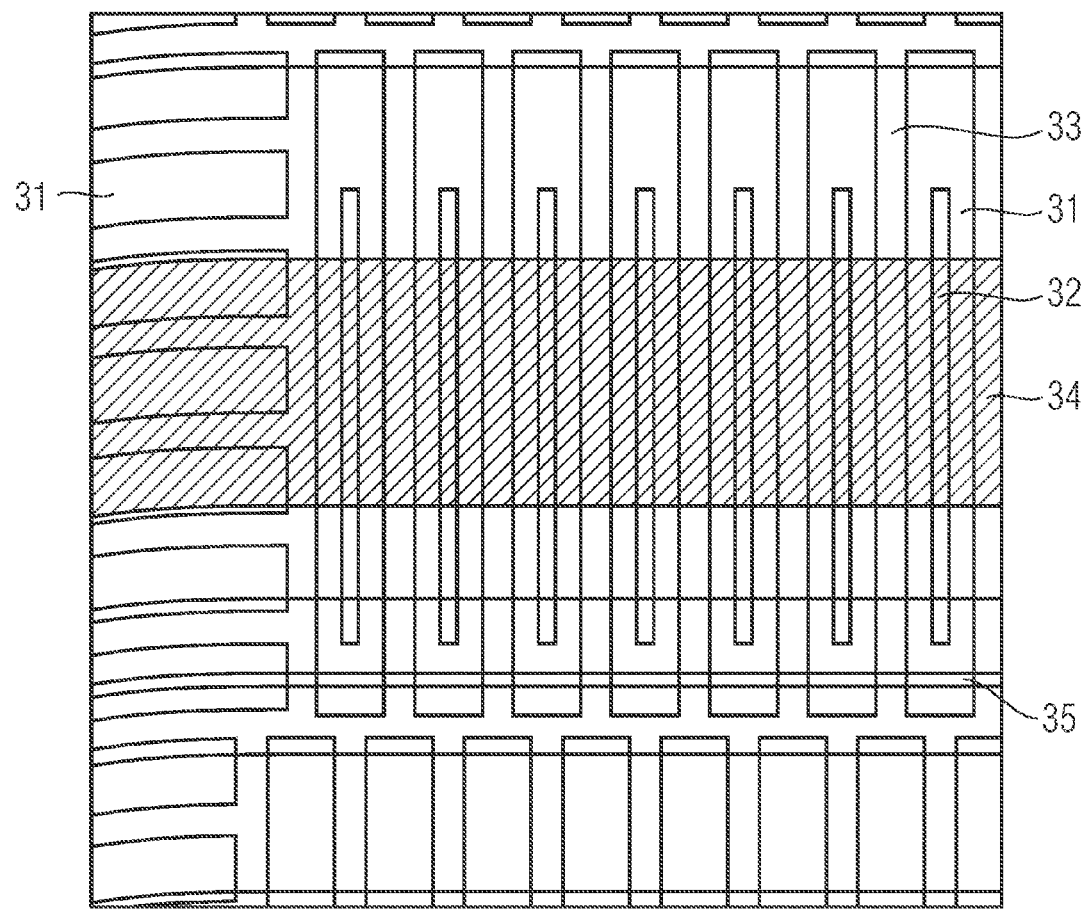
FIG. 9 shows a sixth embodiment of a power semiconductor device according to the invention in plan view.

FIG. 9 shows a plan view of an embodiment of a power semiconductor device according to the invention. A plurality of vertically and horizontally arranged trench zones 31 can be seen, contact hole strips 32 being provided in the vertically arranged trench zones 31. Mesa zones 33 are situated between the trench zones 31. A metallization layer 34 is furthermore provided which is provided above the trench zones 31 and is insulated from the latter.

In accordance with some embodiments, a horizontal polysilicon plug 35 is provided, which forms an electrical connection between polyelectrodes in the trench zones 31 and the mesa zones 33. The polysilicon plug 35 comprises a trench filled with polysilicon. In this way, it is possible to realize an electrical contact between source regions (mesa) and polysilicon electrodes; in accordance with some embodiments, the contact hole strips 32 connect the metallization layer to the polyelectrodes in the trench zones 31.

In accordance with some embodiments, the plug structures made of polysilicon or tungsten have both a contact-making function and a wiring function (the plug structures form a wiring plane). The use of the plugs as wiring for low-current lines, for example, therefore makes it possible, under certain conditions, to save a wiring plane or to provide a space-saving edge field plate construction.

The material of the plug structures preferably comprises a different material than that of the metallization layers, so that the metallization layers can be etched selectively with respect to the plug structures during fabrication. The metallization layers should preferably comprise Al, AlSi, AlSiCu or Cu, the plug structures should preferably comprise tungsten (with a barrier) or a doped polysilicon, preferably with thin silicide. A precise selective etching process can thus be ensured.

The invention can be applied particularly advantageously to vertical power transistors with a drain terminal on the rear side.

The invention claimed is:

1. A vertical power semiconductor device comprising:
a semiconductor substrate;
a doped zone within the semiconductor substrate, the doped zone adjoining a first surface of the semiconductor substrate;
a polysilicon layer in a trench at a front side of the semiconductor substrate, the polysilicon layer being electrically isolated from the semiconductor substrate by an insulating layer;
a patterned conductive structure, wherein plug structures form parts of the same patterned conductive structure, a first portion of the plug structures forming a vertical electrical connection between a semiconductor zone and a metallization layer positioned above the semiconductor zone, and a second portion of the plug structures comprising an elongate plug structure extending in a lateral direction in or above the semiconductor substrate, the elongate plug structure providing electrical connection between the doped zone and the polysilicon layer, and wherein an electric contact interface between the elongate plug structure and the polysilicon layer is at or below the first surface; and
a drain terminal on a rear side of the semiconductor substrate.

2. The vertical power semiconductor device of claim 1, wherein a bottom side of the elongate plug structure abuts on each one of the doped zone, the insulating layer and the polysilicon layer at a same vertical level with respect to the first surface.

3. The vertical power semiconductor device of claim 1, wherein the plug structures are laterally oriented trenches filled with polysilicon.

4. The vertical power semiconductor device of claim 1, wherein the plug structures are laterally oriented trenches filled with tungsten.

5. The vertical power semiconductor device of claim 1, wherein the plug structures provide electrical lines operable to carry lateral current flows within a cell array, within an edge region or within a logic region of the semiconductor device.

6. The vertical power semiconductor device of claim 5, wherein the plug structures make contact with semiconductor zones of the cell array.

7. The vertical power semiconductor device of claim 6, wherein the plug structures are positioned at least in part directly on the semiconductor zones of the cell array.

8. The vertical power semiconductor device of claim 6, wherein the plug structures are connected at least in part by the semiconductor zones of the cell array.

9. The vertical power semiconductor device of claim 6, wherein the plug structures are isolated at least in part from the semiconductor zones of the cell array by an insulation layer.

* * * * *